(12) United States Patent
Wang et al.

(10) Patent No.: US 8,587,036 B2
(45) Date of Patent: Nov. 19, 2013

(54) NON-VOLATILE MEMORY AND FABRICATING METHOD THEREOF

(75) Inventors: Shih-Chen Wang, Taipei (TW); Wen-Hao Ching, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 707 days.

(21) Appl. No.: 12/333,315

(22) Filed: Dec. 12, 2008

(65) Prior Publication Data
US 2010/0148238 A1    Jun. 17, 2010

(51) Int. Cl.
*H01L 29/788* (2006.01)
(52) U.S. Cl.
USPC ........... 257/239; 257/261; 257/314; 257/315; 257/316; 257/319; 257/320; 257/321; 257/322; 257/E21.422; 257/E21.68; 257/E21.662; 257/E29.3; 257/E21.681; 257/E27.098; 257/E21.661; 257/E29.129; 257/E29.302; 257/E29.305; 257/E29.306; 257/E29.312; 257/E21.179; 439/199; 439/201; 439/211; 439/592
(58) Field of Classification Search
None
See application file for complete search history.

(56) References Cited

U.S. PATENT DOCUMENTS

| | | | |
|---|---|---|---|
| 6,678,190 B2 | 1/2004 | Yang et al. | |
| 7,226,828 B2 * | 6/2007 | Hsieh et al. | 438/201 |
| 2004/0159881 A1 | 8/2004 | Chindalore et al. | |
| 2006/0043463 A1 | 3/2006 | Liu et al. | |
| 2009/0121275 A1 * | 5/2009 | Kim et al. | 257/321 |

OTHER PUBLICATIONS

Sze, S.M. Physics of Semiconductor Devices. New York: John Wiley and Sons, Inc. 1981.*

* cited by examiner

*Primary Examiner* — Fei Fei Yeung Lopez
(74) *Attorney, Agent, or Firm* — Jianq Chyun IP Office

(57) ABSTRACT

A non-volatile memory is formed on a substrate. The non-volatile memory includes an isolation structure, a floating gate, and a gate dielectric layer. The isolation structure is disposed in the substrate to define an active area. The floating gate is disposed on the substrate and crosses over the active area. The gate dielectric layer is disposed between the floating gate and the substrate. The floating gate includes a first region and a second region. An energy band of the second region is lower than an energy band of the first region, so that charges stored in the floating gate are away from an overlap region of the floating gate and the gate dielectric layer.

30 Claims, 14 Drawing Sheets

NON-VOLATILE MEMORY AND FABRICATING METHOD THEREOF

BACKGROUND OF THE INVENTION

1. Field of the Invention

The present invention relates to a semiconductor device. More particularly, the present invention relates to a non-volatile memory and a fabricating method thereof.

2. Description of Related Art

As techniques for manufacturing deep sub-micron semiconductors start to mature, physical dimensions of devices are reduced little by little. Hence, the size of memory cells in memory devices has become smaller and smaller. In another aspect, since information electronic products including computers, mobile phones, digital cameras, and personal digital assistants (PDA) are required to process and store an increasing amount of data, memory capacity required by these information electronic products is increased accordingly. In order to satisfy the formidable demand for the memory devices with compactness and large memory volume, producing small-sized and highly-integrated memory devices featuring fine quality is one of the common goals to be achieved by this industry.

Among the memory devices, a non-volatile memory is capable of safeguarding written data even after the power supplied to the non-volatile memory is cut off, and therefore the non-volatile memory has been extensively applied to personal computers and electronic equipments.

The non-volatile memory can be classified into a mask read only memory (ROM), an erasable programmable ROM (EPROM), an electrically erasable programmable ROM ($E^2$PROM), and a one-time-programmable ROM (OT-PROM) based on the way by which data are stored in the memory.

U.S. Pat. No. 6,678,190 discloses a non-volatile memory in which the formation of multiple polysilicon layers is not required. Instead, two serially connected p-type metal-oxide-semiconductor (MOS) transistors respectively disposed on an N well as a select gate and a floating gate are disposed in the non-volatile memory. Since it is not necessary to form a control gate in the non-volatile memory, a fabricating process of the non-volatile memory can be integrated with a fabricating process of a complementary MOS transistor, thereby reducing fabricating costs.

US Patent Publication No. 2004/0159881 discloses a non-volatile memory device in which the Stacked SiGe—Si floating gate is formed to accumulate charges away from the tunneling gate oxide. US Patent Publication No. 2006/0043463 discloses a floating gate in which an altered floating gate material is used to increase barrier height between floating gate and tunneling dielectric layer.

Nonetheless, in the above-mentioned non-volatile memory, charges are stored in the floating gate for determining digital information. During programming operation of the non-volatile memory, the charges cross over a gate dielectric layer disposed under the floating gate, and the charges then enter into the floating gate. Hence, the gate dielectric layer is apt to be damaged, which leads to occurrence of current leakage. Besides, the gate dielectric layer is indispensable to be shrunk as the process scaling proceeding, in order to keep gate-driving capabilities of transistors. In particular, divot regions are formed in interfaces of the gate dielectric layer and corners of an isolation structure, such as a shallow trench isolation structure, in the device. The gate dielectric layer in the divot regions is relatively thin, and the gate-stored charges are prone to leak therein. Therefore, data retention efficacy of the memory device by using of the generic oxide process in a given process is vulnerably likely to be reduced thereby. Additionally, as integrity of the device increases and the thickness of the gate dielectric layer below the floating gate is reduced, the current leakage tends to be even deteriorated. As such, it is crucial to improve the data retention efficacy of the memory device.

SUMMARY OF THE INVENTION

In view of the foregoing, the present invention is directed to a non-volatile memory, a floating gate of which has specific energy-level engineering regions made by doping concentration gradients across the floating gate, while the regions are away from an overlap region of the floating gate and a gate dielectric layer. In one practical case, a p-type single-poly floating-gate memory cell has n-type-doped end-cap regions above isolation regions. Thereby, data retention efficacy and reliability of a memory device can be improved.

The present invention is further directed to a fabricating method of a non-volatile memory. By applying the fabricating method, the non-volatile memory can be manufactured without modifying a normal manufacturing process of a complementary MOS, and data retention efficacy and reliability of a memory device can be improved as well.

A non-volatile memory formed on a substrate is provided in the present invention. The non-volatile memory includes an isolation structure, a floating gate, and a gate dielectric layer. The isolation structure is disposed in the substrate to define an active area. The gate dielectric layer is disposed on the active area over the substrate. The floating gate is disposed upon the gate dielectric layer and the isolation structure. The floating gate includes a first region and a second region, wherein the first region includes all the gate-oxide-overlapped region and part of regions over the isolation structures beside the gate-oxide-overlapped one, and the second region contains the rest of the floating gate. An energy band level of the second region is made to be different from that of the first region by an lighter implantation of same implantation over the gate oxide region, or an reverse type of implantation over the gate oxide region, such that charges in the floating gate will be stored away from an overlap region of the floating gate and the gate dielectric layer. In order to apply this invention well, the implantation of the second region needs to be well designed, such as in electron-stored floating-gate memory cells, the second region should be made to have lower energy band level, while in hole-stored ones, the second region should be vice versa.

In an embodiment of the present invention, a conductive type of the second region is opposite to a conductive type of the first region.

In an embodiment of the present invention, a conductive type of the second region is the same as a conductive type of the first region, and a dopant concentration of the second region is lower than a dopant concentration of the first region. Here, the conductive type of the first and second regions is either the n-type or the p-type.

In an embodiment of the present invention, the first region is at least overlapped with the gate dielectric layer.

In an embodiment of the present invention, the second region is located right above the isolation structure.

In an embodiment of the present invention, the non-volatile memory further includes two doped regions formed on the active area, at the respective sides of the floating gate.

In an embodiment of the present invention, the non-volatile memory further includes a select gate disposed on the substrate and electrically connected to the floating gate through one of the two doped regions.

In an embodiment of the present invention, the first region is disposed across the active area.

In an embodiment of the present invention, the floating gate further includes a third region, the third region is disposed on the active area, the second region is disposed on the isolation structure, and the first region is disposed between the second and the third regions, wherein a gradient profile of energy band diagram of the first region is formed so as to keep most of charges injected from the active area stored in the second region of the floating gate.

In an embodiment of the present invention, the non-volatile memory further includes a controlling node and a dielectric layer. The controlling node is formed on top of the floating gate. The dielectric layer formed between the controlling node and the floating gate. The controlling node is capacitively coupled to the floating gate by the dielectric layer. The controlling node is a conductive layer stacked on the floating gate.

In an embodiment of the present invention, the non-volatile memory further includes A controlling node and a dielectric layer. The controlling node is formed in the substrate. The dielectric layer formed between the controlling node and the floating gate. The controlling node is capacitively coupled to the floating gate by the dielectric layer. The controlling node is formed as a doped region, and the doped region is formed in a well in the substrate.

A non-volatile memory formed on a substrate is provided in the present invention. The non-volatile memory includes an isolation structure, a floating gate, and a gate dielectric layer. The isolation structure is disposed in the substrate to define an active area. The gate dielectric layer is disposed on the active area over the substrate. The floating gate is disposed upon the gate dielectric layer and the isolation structure, and across the active area. The floating gate comprises a first region and a second region, the first region is disposed adjacent to gate dielectric layer, the second region is disposed apart from the gate dielectric layer, and the energy band levels of the first region and the second region are made different by doping process so as to keep most of charges stored in the second region of the floating gate.

In an embodiment of the present invention, the second region is disposed on the first region.

In an embodiment of the present invention, the first region is disposed on the active area, as well as the interface of the isolation structure and the active area, and the second region is located right above the isolation structure.

In an embodiment of the present invention, the non-volatile memory further includes a controlling node and a dielectric layer. The controlling node is formed on top of the floating gate. The dielectric layer formed between the controlling node and the floating gate. The controlling node is capacitively coupled to the floating gate by the dielectric layer. The controlling node is a conductive layer stacked on the floating gate.

In an embodiment of the present invention, the non-volatile memory further includes a controlling node and a dielectric layer. The controlling node is formed in the substrate. The dielectric layer formed between the controlling node and the floating gate. The controlling node is capacitively coupled to the floating gate by the dielectric layer. The controlling node is formed as a doped region, and the doped region is formed in a well in the substrate.

In the non-volatile memory of the present invention, the floating gate is divided into a first region and a second region. The energy band level of the second region is lower than that of the first region, and the second region is away from the interface of the gate dielectric layer and the isolation structure (a divot region with possibly thinner gate oxides) or the overlap region of the floating gate and the gate dielectric layer. Accordingly, the charges in the floating gate are collectively stored in the second region, and thereby the data retention of the memory device is rather unlikely to be affected by the quality of the gate dielectric layer or the possible damages by relatively high voltage during programming or erasing operations. As such, the reliability of the memory device is improved.

The present invention further provides a fabricating method of a non-volatile memory. The fabricating method includes following steps. First, a substrate is provided and an isolation structure is already formed therein to define an active area. Next, a gate dielectric layer is formed on the substrate, and a floating gate is formed on the substrate as well. Here, the floating gate crosses over the active area. After that, a first dopant implantation process is performed to form a first region in a portion of the floating gate. In other process steps, a second dopant implantation process is performed to form a second region in the other portion of the floating gate. An energy band level of the second region is lower than an energy band of the first region, so as to keep charges stored in the floating gate away from an overlap region of the floating gate and the gate dielectric layer.

In an embodiment of the present invention, a conductive type of the second region is opposite to a conductive type of the first region. An p-type dopant is implanted into the first region in the first doping process, and a n-type dopant is implanted into the second region in the second doping process. Alternatively, a n-type dopant is implanted into the first region in the first doping process, and an p-type dopant is implanted into the second region in the second doping process.

In an embodiment of the present invention, a conductive type of the second region is the same as a conductive type of the first region, and a dopant concentration of the second region is lower than a dopant concentration of the first region.

In an embodiment of the present invention, a p-type or an n-type dopant is implanted into the first region in the first dopant implantation process, but the second region is masked during all implantation processes so that no dopant implanted in process steps other than in-situ doping during poly-silicon deposition.

In an embodiment of the present invention, the first region is at least overlapped with the gate dielectric layer.

In an embodiment of the present invention, the second region is formed right above the isolation structure.

In an embodiment of the present invention, the fabricating method of the non-volatile memory further includes forming a select gate on the substrate. The select gate is electrically connected to the floating gate.

In an embodiment of the present invention, the fabricating method of the non-volatile memory further includes forming a dielectric layer on the floating gate and forming a controlling node on the dielectric layer. The controlling node is capacitively coupled to the floating gate by a dielectric layer. The controlling node is an conductive layer stacked on the floating gate In an embodiment of the present invention, the fabricating method of the non-volatile memory further includes forming a controlling node in the substrate and forming a dielectric layer between the floating gate and the controlling node. The controlling node is capacitively coupled to the floating gate by a dielectric layer. The controlling node is formed as a doped region, and the doped region is formed in a well in the substrate.

The present invention further provides a fabricating method of a non-volatile memory. The fabricating method includes following steps. First, a substrate is provided, wherein an isolation structure being formed in the substrate to define an active area. A gate dielectric layer is formed on the active area over the substrate. A floating gate consisting of conductive materials is formed on the gate dielectric layer, and across the active area. A first doping process is performed to form a first region in a portion of the floating gate, therefore energy band levels of a second region of the floating gate are different from energy band levels of the first region, so as to keep charges mostly stored in the second region of the floating gate away from an overlap region of the floating gate and the gate dielectric layer.

In an embodiment of the present invention, the conductive materials of the floating gate consist of an in-situ doped polycrystalline silicon.

In an embodiment of the present invention, the first region is at least overlapped with the gate dielectric layer.

In an embodiment of the present invention, the second region is formed right above the isolation structure.

According to the fabricating method of the non-volatile memory in the present invention, the first region and the second region having different energy band levels are formed in the floating gate. In order to store electrons well, the energy band level of the second region is lower than that of the first region, and the second region is away from the junction of the gate dielectric layer and the isolation structure (the divot region). Accordingly, the charges in the floating gate are collectively stored in the second region, and thereby the data retention of the memory device is rather unlikely to be affected by the quality of the gate dielectric layer, or the possible damages by relatively high voltage during programming or erasing operations. But if holes were to be stored, the second region should be made vice versa. As such, the reliability of the memory device is improved.

Moreover, according to the fabricating method of the non-volatile memory in the present invention, the energy band levels in different regions can be changed merely by performing ion implantation processes to implant different dopants or dopants with different concentrations into the different regions of the floating gate. Therefore, the non-volatile memory of the present invention can be manufactured without modifying the normal manufacturing process of the complementary MOS. Namely, the fabricating method of the non-volatile memory in the present invention is relatively simple.

To make the above and other features and advantages of the present invention more comprehensible, several embodiments accompanied with figures are detailed as follows.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

A non-volatile memory of the present invention is first discussed below.

Figure 1A:
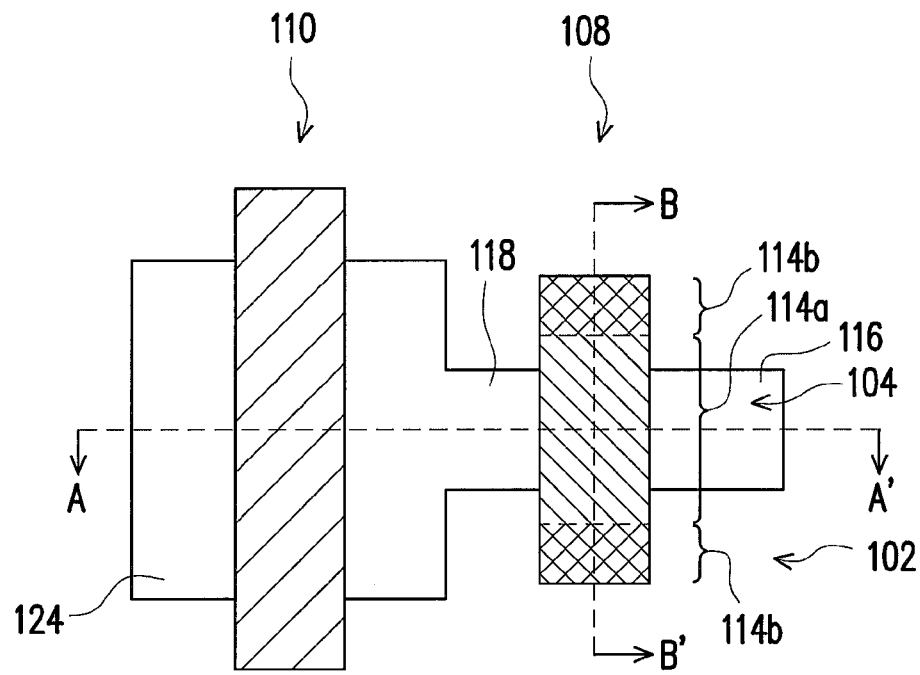
FIG. 1A is a top view of a non-volatile memory according to an embodiment of the present invention.
Figure 1B:
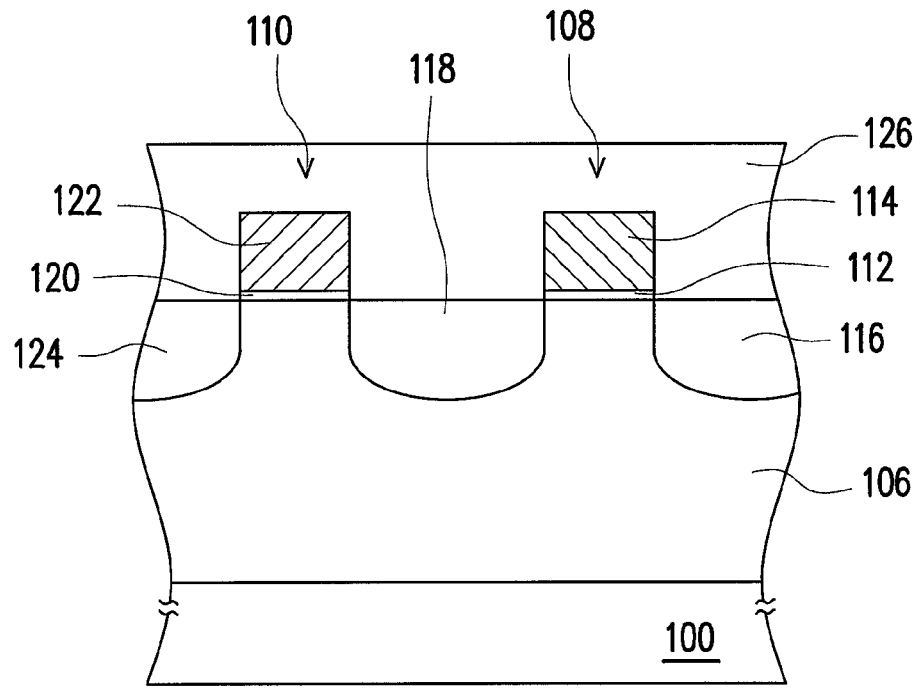
FIG. 1B is a cross-sectional view taken along a line A-A' depicted in FIG. 1A.
Figure 1C:
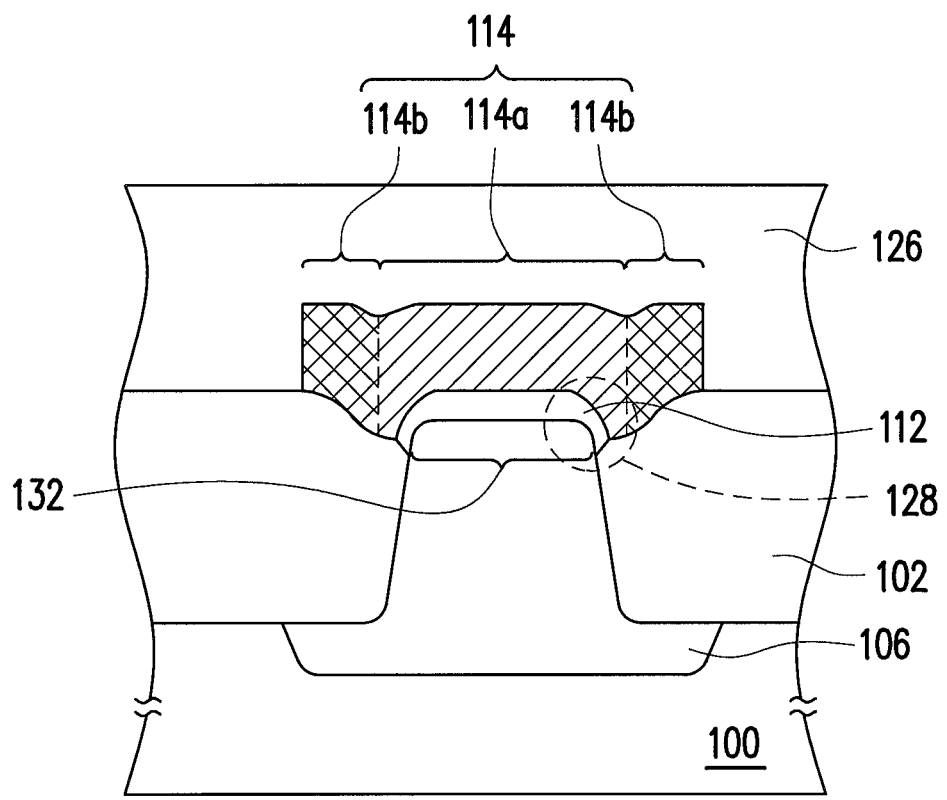
FIG. 1C is a cross-sectional view taken along a line B-B' depicted in FIG. 1A.
Figure 1D:
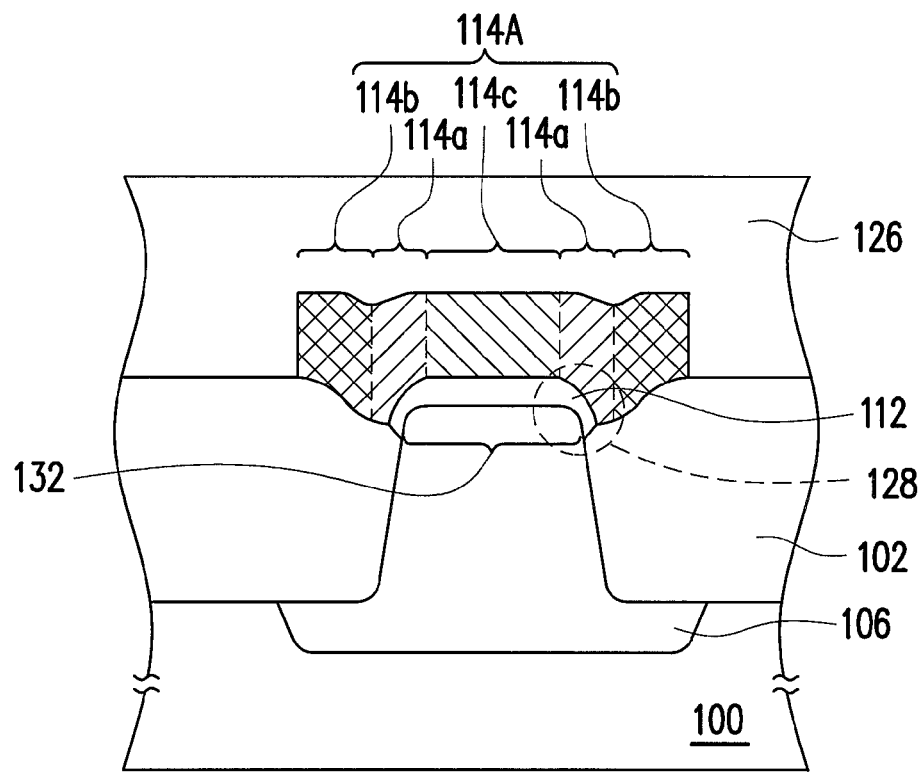
FIGS. 1D and 1E are cross-sectional views of a non-volatile memory according to other embodiments of the present invention.
Figure 1E:
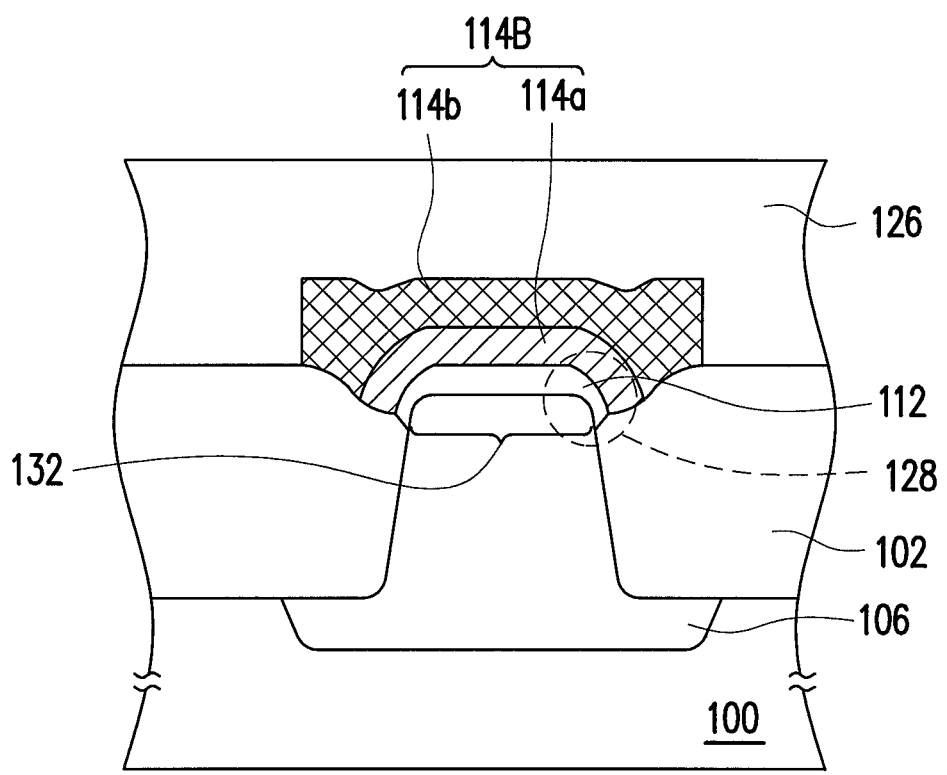
Figure 1F:
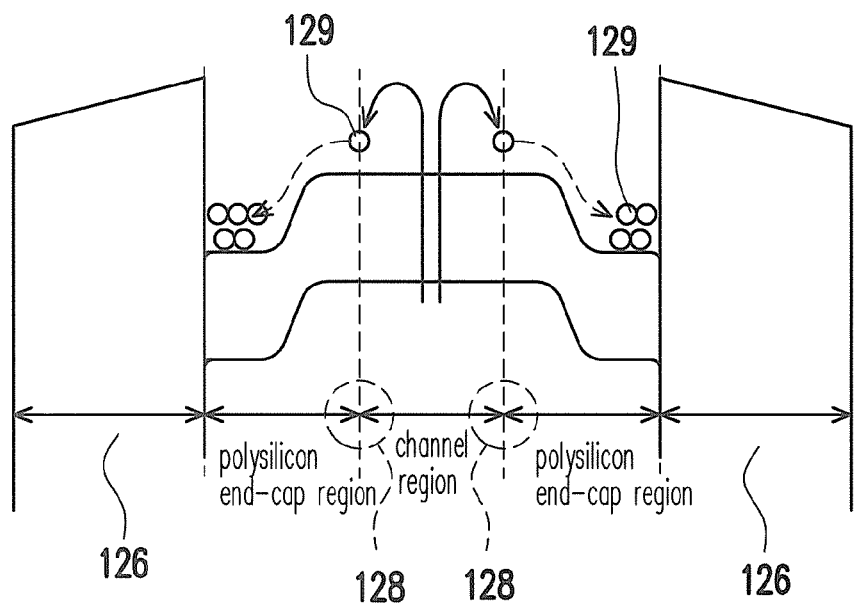
FIG. 1F is a schematic view of an energy band level taken along the line B-B' depicted in FIG. 1A.

FIG. 1A is a top view of a non-volatile memory according to an embodiment of the present invention. FIG. 1B is a cross-sectional view taken along a line A-A' depicted in FIG. 1A. FIG. 1C is a cross-sectional view taken along a line B-B' depicted in FIG. 1A. FIGS. 1D and 1E are cross-sectional views of a non-volatile memory according to other embodiments of the present invention. FIG. 1F is a schematic view of an energy band level taken along the line B-B' depicted in FIG. 1A.

Referring to FIGS. 1A to 1C, the non-volatile memory of the present invention is, for example, disposed on a substrate 100. The substrate 100 is, for example, a silicon substrate. An isolation structure 102 is, for example, disposed in the substrate 100 to define an active area 104. The isolation structure 102 is, for example, a shallow trench isolation (STI) structure. A well 106 is also formed in the substrate 100, for example.

The non-volatile memory includes a floating gate transistor 108 and a select gate transistor 110. The floating gate transistor 108 and the select gate transistor 110 are, for example, disposed on the substrate 100 and are connected to each other in series.

The floating gate transistor 108, for example, includes a gate dielectric layer 112, a floating gate 114, a source/drain region 116, and a source/drain region 118.

The floating gate 114 is, for example, disposed on the substrate 100 and crosses over the active area 104. Hence, a portion of the floating gate 114 is located on the isolation structure 102. The floating gate 114 is fabricated by doped polysilicon, for example. Besides, the floating gate 114 is, for example, divided into a first region 114a and a second region 114b. The first region 114a is disposed adjacent to gate dielectric layer 112, the second region 114b is disposed apart from the gate dielectric layer 112. An energy band level of the second region 114b is lower than an energy band level of the first region 114a, such that electrons stored in the floating gate 114 are away from an overlap region 132 of the floating gate 114 and the gate dielectric layer 112. As shown in FIG. 1C, the first region 114a is at least overlapped with the gate dielectric layer 112. The second region 114b is away from the gate dielectric layer 112 and is disposed right above the isolation structure 102.

In an embodiment of the present invention, a method of reducing the energy band level of the second region 114b to be lower than the energy band level of the first region 114a includes making a conductive type of the second region 114b to be opposite to a conductive type of the first region 114a. For instance, when the conductive type of the second region 114b is an n-type, the conductive type of the first region 114a is a p-type. Alternatively, if holes to be stored in the floating gate, the conductive type of the second region 114b would be a p-type one, and the conductive type of the first region 114a is an n-type.

In another embodiment as FIG. 1C, a method of reducing the energy band level of the second region 114b to be lower than the energy band level of the first region 114a includes equalizing a conductive type of the second region 114b to a conductive type of the first region 114a, while the second region 114b has a lower dopant concentration than that of the first region 114a. Here, the conductive type of the first and second regions 114a and 114b is p-type.

In another embodiment as FIG. 1C, a method of reducing the energy band level of the second region 114b to be lower than the energy band level of the first region 114a includes masking the second region 114b through all the implantation process steps following poly-silicon gate deposition, while the second region 114b merely has in-situ doping during the conventional poly-silicon deposition step.

In another embodiment as shown in FIG. 1D, a floating gate 114A includes a first region 114a, a second region 114b, and a third region 114c. The third region 114c is disposed on the active area, the second region 114b is disposed on the isolation structure, and the first region 114a is disposed between the third region 114c and the second region 114b. A gradient profile of energy band diagram of the first region 114a is formed so as to keep most of charges injected from the active area stored in the second region 114b of the floating gate. The conductive type and concentration of first region 114a and second region 114b are the same as described above. The conductive type and concentration of third region 114c are the same as second region 114b.

In another embodiment as shown in FIG. 1E, a floating gate 114B includes a first region 114a and a second region 114b, and the second region 114b is disposed on the first region 114a. The energy band levels of the first region 114a and the second region 114b are made different by doping process so as to keep most of charges stored in the second region 114b of the floating gate 114. The conductive type and concentration of first region 114a and second region 114b are in the same manners as described above.

The gate dielectric layer 112 is, for example, disposed between the floating gate 114 and the substrate 100. A material of the gate dielectric layer 112 is, for example, silicon oxide.

The source/drain region 116 and the source/drain region 118 are, for example, respectively disposed in the substrate 100 at respective sides of the floating gate 114. In addition, the source/drain region 116 and the source/drain region 118 are disposed within the active area 104.

The select gate transistor 110, for example, includes a gate dielectric layer 120, a select gate 122, the source/drain region 118, and a source/drain region 124.

The select gate 122 is, for example, disposed on the substrate 100 and crosses over the active area 104. A material of the select gate 122 is, for example, doped polysilicon.

The gate dielectric layer 120 is, for example, disposed between the select gate 122 and the substrate 100. A material of the gate dielectric layer 120 is, for example, silicon oxide.

The source/drain region 118 and the source/drain region 124 are, for example, respectively disposed in the substrate 100 at respective sides of the select gate 122. In addition, the source/drain region 118 and the source/drain region 124 are disposed within the active area 104. The floating gate transistor 108 and the select gate transistor 110 share the source/drain region 118.

An interlayer insulation layer 126 is disposed on the substrate 100 and covers the floating gate transistor 108 and the select gate transistor 110.

A material of the interlayer insulation layer 126 is, for example, phosphorous silicon glass, boron phosphorous silicon glass, and so forth.

Referring to FIGS. 1C and 1F, divot regions 128 are formed in interfaces of the active area 104 and the isolation structure 102. In a conventional non-volatile memory, the divot regions 128 are apt to form more interface states and generated trap sites in the edge of gate dielectric layer 112, such that a current leakage path is formed. Namely, the charges in the floating gate are prone to leak into the substrate through the divot regions. However, in the non-volatile memory of the present invention, the floating gate 114 is divided into the first region 114a and the second region 114b by dosage engineering. The energy band level of the second region 114b is lower than the energy band level of the first region 114a, and the second region 114b is arranged apart from the divot regions 128. As shown in FIG. 1F, when channel hot charges are injected into the floating gate 114, injected charges 129 loss the potential thereof and are then moved toward a region with a low energy band level, i.e. the second region 114b of the floating gate 114. Hence, the charges stored in the floating gate 114 are away from the interfaces of the gate dielectric layer 112 and the isolation structure 102 (ie., the divot regions 128), and are then stored in the second region 114b of the floating gate 114. The electrons stored in region 114b are not only apart from the possible leakage path 128, but also has lower electric field built around, since the thickness of the surround dielectric layer 126 is much more than the gate oxide. Since the floating gate is isolated from other conductive materials, such as source/drain silicon region, the charges 129 stored at any region of the floating gate will contribute to the same potential of the floating gate. The locally stored electrons hence lead to an increase in the voltage level of the floating gate 114 and a decrease in the capacitance between a channel and the floating gate 114.

Figure 2A:
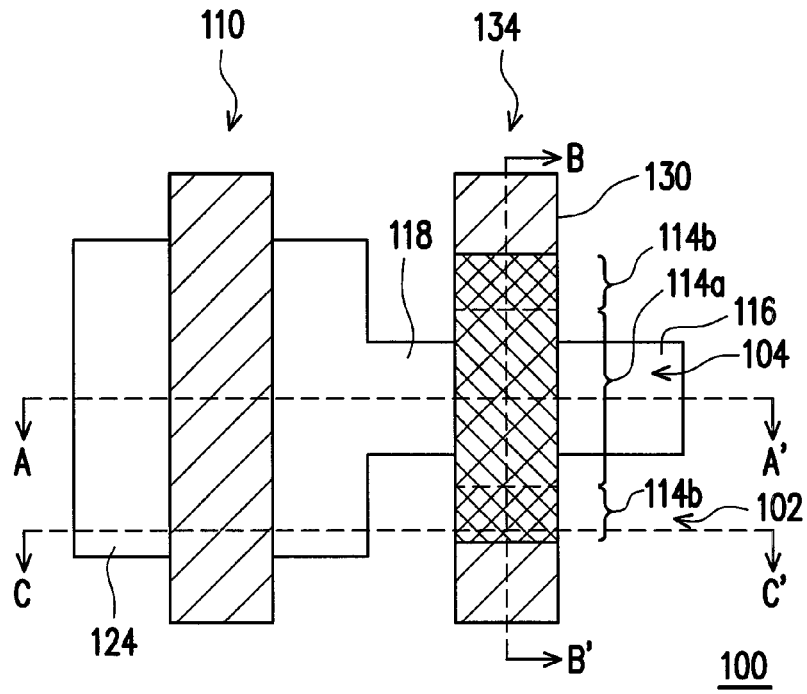
FIG. 2A is a top view of a non-volatile memory according to an embodiment of the present invention.
Figure 2B:
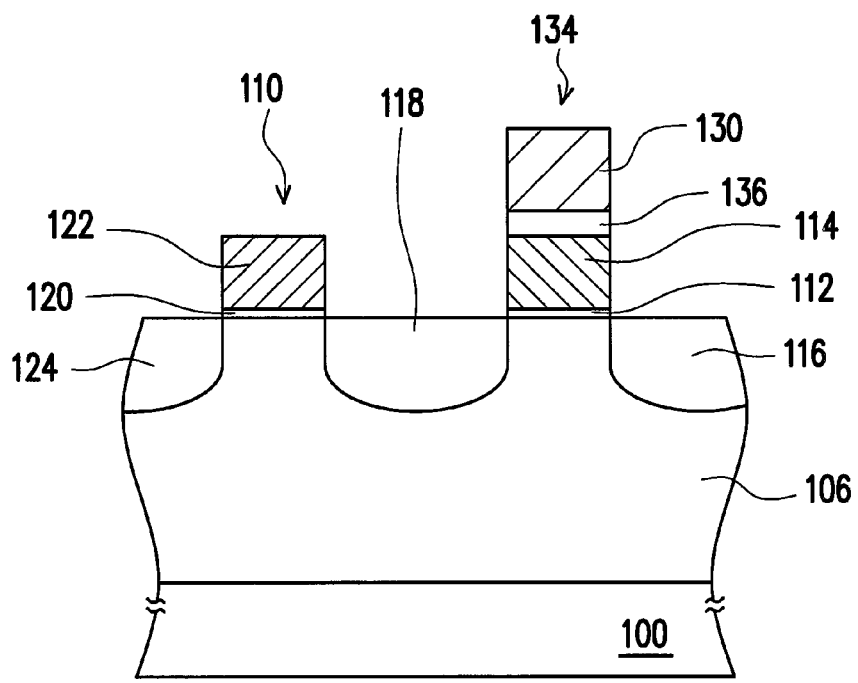
FIG. 2B is a cross-sectional view taken along a line A-A' depicted in FIG. 2A.
Figure 2C:
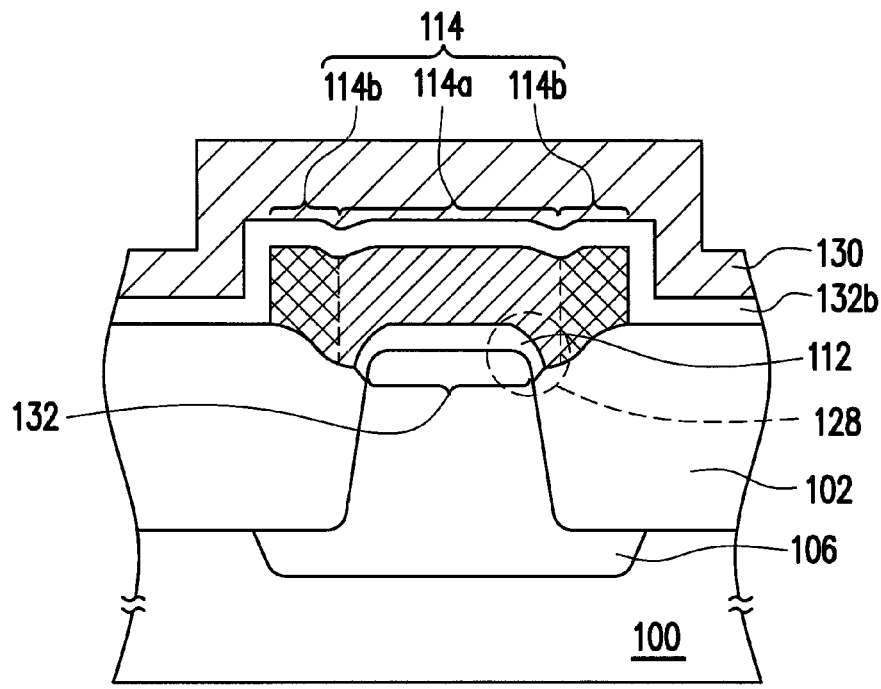
FIG. 2C is a cross-sectional view taken along a line B-B' depicted in FIG. 2A.
Figure 2D:
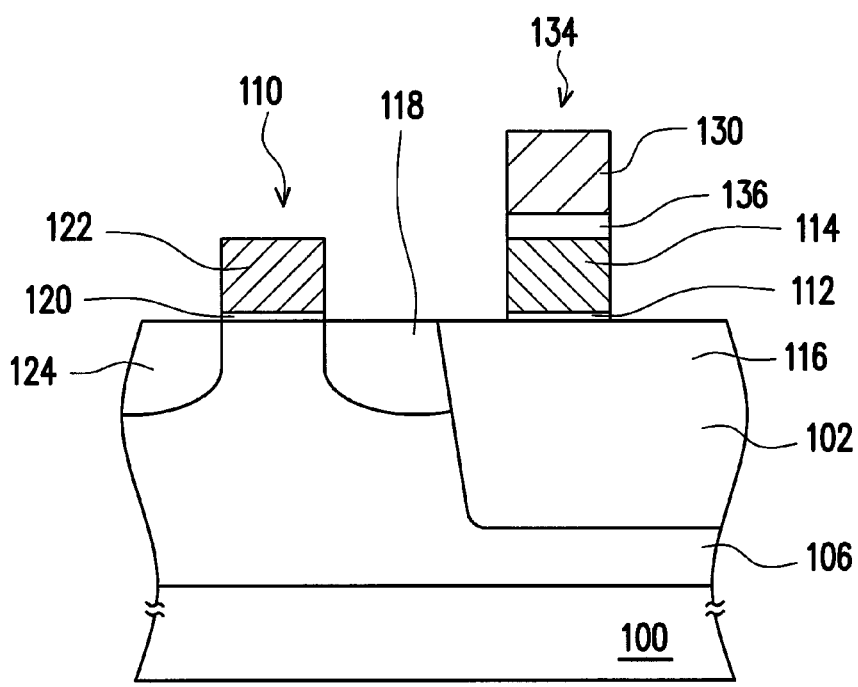
FIG. 2D is a cross-sectional view taken along a line C-C' depicted in FIG. 2A.

FIG. 2A is a top view of a non-volatile memory according to an embodiment of the present invention. FIG. 2B is a cross-sectional view taken along a line A-A' depicted in FIG. 2A. FIG. 2C is a cross-sectional view taken along a line B-B' depicted in FIG. 2A. FIG. 2D is a cross-sectional view taken along a line C-C' depicted in FIG. 2A. In FIGS. 2A-2D, the components same as those in FIGS. 1A-1C have the same reference numerals and the descriptions thereof are skipped herein. Only the differences between the two will be described below.

Referring to FIGS. 2A to 2D, the non-volatile memory of the present invention is, for example, disposed on a substrate 100. An isolation structure 102 is, for example, disposed in the substrate 100 to define an active area 104. A well 106 is also formed in the substrate 100, for example.

The non-volatile memory includes a floating gate transistor and a select gate transistor 110. The floating gate transistor and the select gate transistor 110 are, for example, disposed on the substrate 100 and are connected to each other in series. The floating gate transistor 108, for example, includes a gate dielectric layer 112, a floating gate 114, a source/drain region 116, and a source/drain region 118.

The floating gate 114 is, for example, disposed on the substrate 100 and crosses over the active area 104. Besides, the floating gate 114 is, for example, divided into a first region 114a and a second region 114b. An energy band level of the second region 114b is lower than an energy band level of the first region 114a, such that electrons stored in the floating gate 114 are away from an overlap region 132 of the floating gate 114 and the gate dielectric layer 112. The floating gate 114 can be replace by the floating gate 114A as shown in FIG. 1D or the floating gate 114B as shown in FIG. 1E.

The select gate transistor 110, for example, includes a gate dielectric layer 120, a select gate 122, the source/drain region 118, and a source/drain region 124.

A dielectric layer 136 is formed on the floating gate 114. The material of the dielectric layer 136 is oxide or nitride, for example. The dielectric layer 136 can be a composite layer such as an oxide/nitride/oxide (ONO) layer.

A conductive layer 130 served as a controlling node is formed on the dielectric layer 136. A material of the conductive layer 130 is, for example, doped polysilicon. The conductive layer 130, the dielectric layer 136 and the floating gate 114 form a stacked-gate structure 134. In such a stacked-gate structure 134, the conductive layer 130 is used to couple the voltage of the floating gate in a capacitive manner.

Figure 3A:
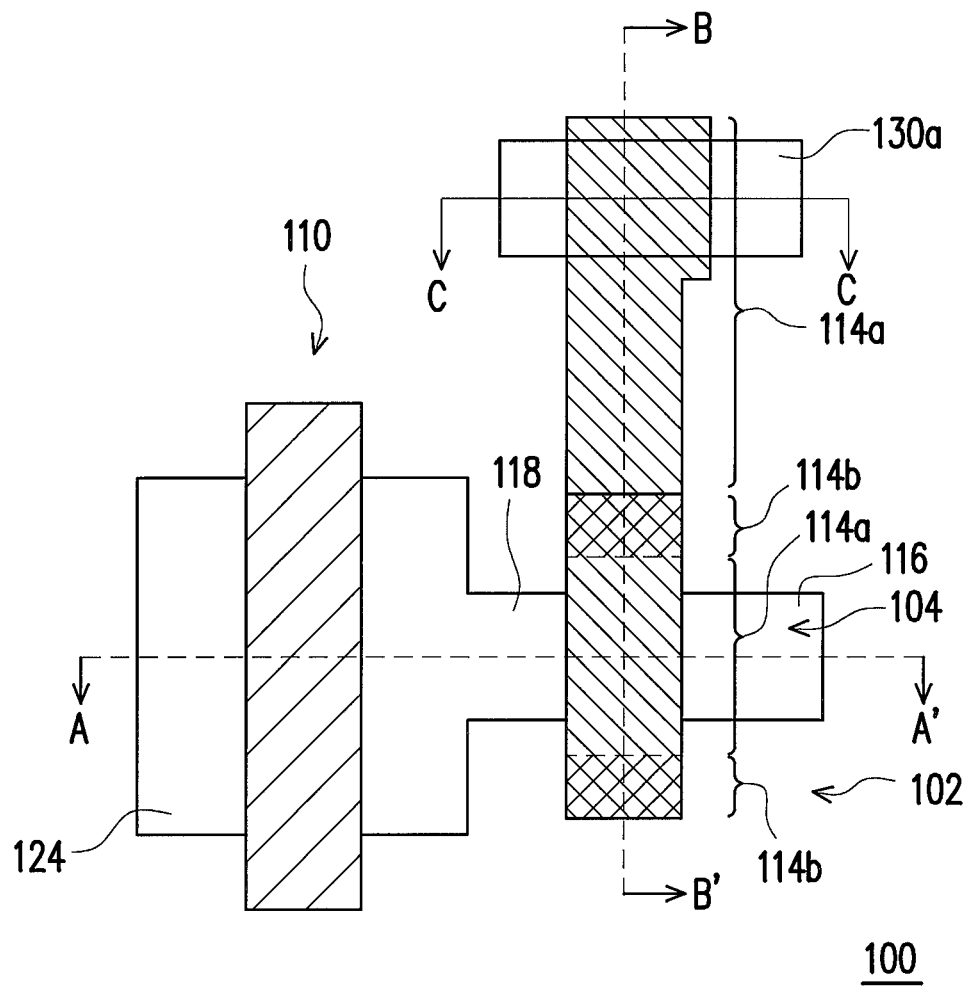
FIG. 3A is a top view of a non-volatile memory according to an embodiment of the present invention.
Figure 3B:
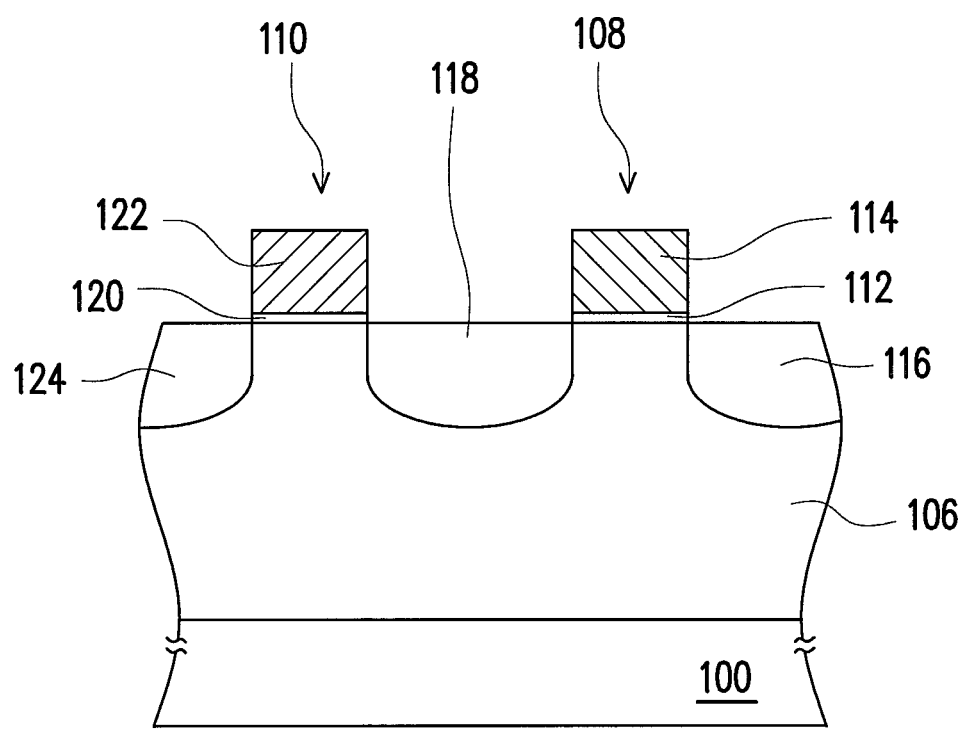
FIG. 3B is a cross-sectional view taken along a line A-A' depicted in FIG. 3A.
Figure 3C:
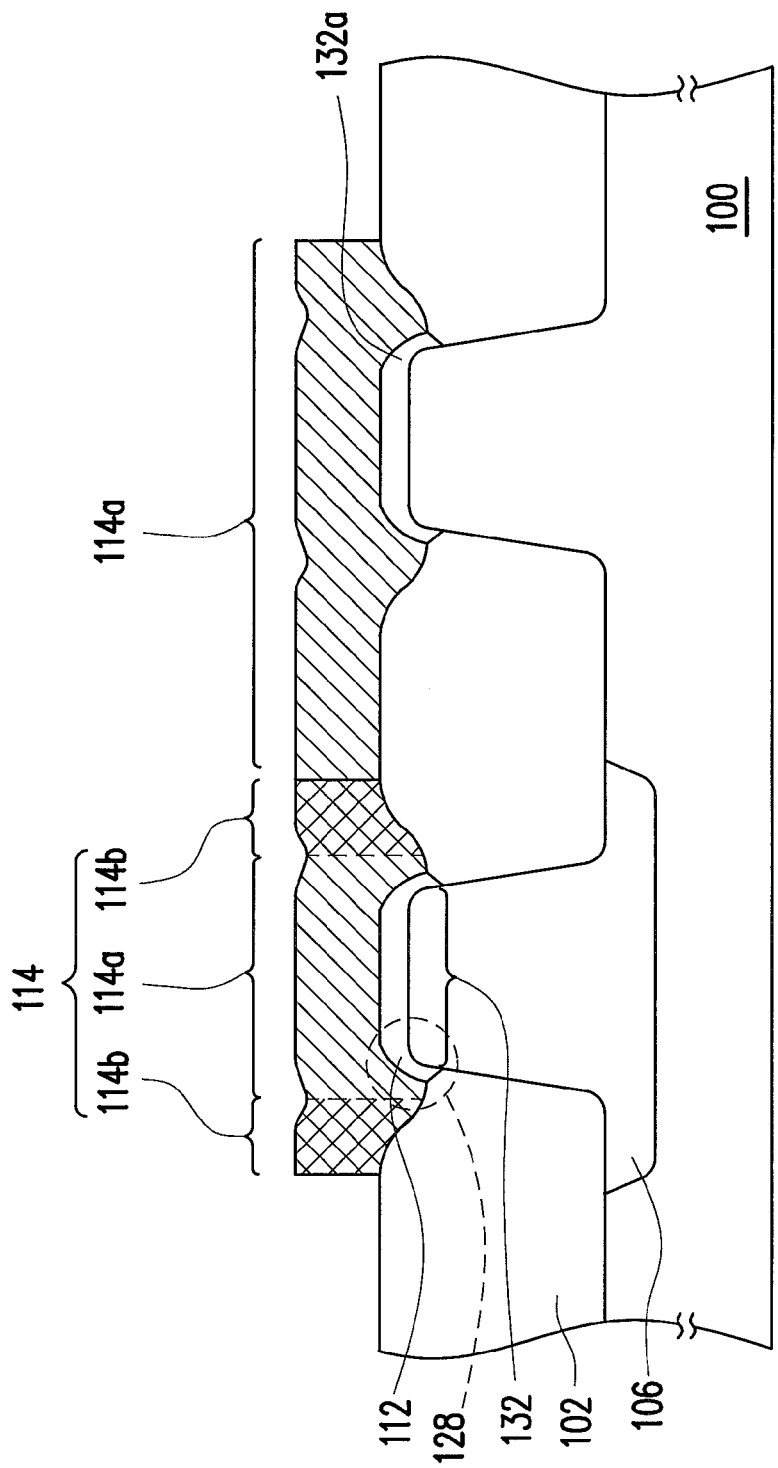
FIG. 3C is a cross-sectional view taken along a line B-B' depicted in FIG. 3A.
Figure 3D:
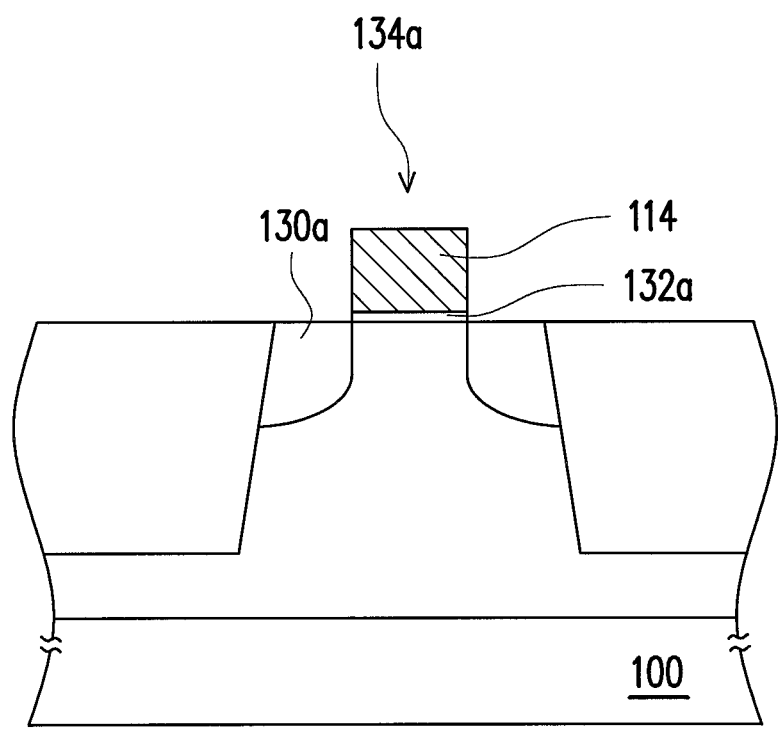
FIG. 3D is a cross-sectional view taken along a line C-C' depicted in FIG. 3A.

FIG. 3A is a top view of a non-volatile memory according to an embodiment of the present invention. FIG. 3B is a cross-sectional view taken along a line A-A' depicted in FIG. 3A. FIG. 3C is a cross-sectional view taken along a line B-B' depicted in FIG. 3A. FIG. 3D is a cross-sectional view taken along a line C-C' depicted in FIG. 3A. In FIGS. 3A-3D, the components same as those in FIGS. 1A-1C have the same reference numerals and the descriptions thereof are skipped herein. Only the differences between the two will be described below.

Referring to FIGS. 3A to 3D, the non-volatile memory of the present invention is, for example, disposed on a substrate 100. An isolation structure 102 is, for example, disposed in the substrate 100 to define an active area 104. A well 106 is also formed in the substrate 100, for example.

The non-volatile memory includes a floating gate transistor and a select gate transistor 110. The floating gate transistor and the select gate transistor 110 are, for example, disposed on the substrate 100 and are connected to each other in series. The floating gate transistor 108, for example, includes a gate dielectric layer 112, a floating gate 114, a source/drain region 116, and a source/drain region 118.

The floating gate 114 is, for example, disposed on the substrate 100 and crosses over the active area 104. Besides, the floating gate 114 is, for example, divided into a first region 114a and a second region 114b. An energy band level of the second region 114b is lower than an energy band level of the first region 114a, such that electrons stored in the floating gate 114 are away from an overlap region 132 of the floating gate 114 and the gate dielectric layer 112. The floating gate 114 can be replace by the floating gate 114A as shown in FIG. 1D or the floating gate 114B as shown in FIG. 1E.

The select gate transistor 110, for example, includes a gate dielectric layer 120, a select gate 122, the source/drain region 118, and a source/drain region 124.

As shown in FIG. 3A, 3C and 3D, a dielectric layer 132a is formed on the substrate 100. A portion of the first region of floating gate 114 extends to cover the dielectric layer 132a. The material of the dielectric layer 132a is oxide, for example.

A doped region 130a served as a controlling node is formed in the substrate 100. The doped region 130a is formed in a well in the substrate. The doped region 130a, the dielectric layer 132a and the floating gate 114 form a diffusion-coupled structure 134a. In such a diffusion-coupled structure 134a, part of the floating gate 114 is further formed above another active area, while a dielectric layer is formed between the floating gate and the doped region 130a.

In the above embodiment of the present invention, the floating gate 114 crosses over the isolation structure 102, and the second region 114b is formed at both ends of the floating gate 114 on the isolation structure 102. It is certain that the second region 114b can only be formed at one end of the floating gate 114. Additionally, the portion of the floating gate 114 crossing over the isolation structure 102 can have a T-shape or an L-shape, so as to enlarge the volume of the second region 114b, or to make the layout of the memory cell in more compact size.

In the non-volatile memory of the present invention, the floating gate 114 is divided into the first region 114a and the second region 114b. The energy band level of the second region 114b is lower than the energy band level of the first region 114a, and the second region 114b and the divot regions 128 are arranged at a distance. Therefore, the charges in the floating gate 114 are collectively stored in the second region 114b and are away from the junctions of the gate dielectric layer 112 and the isolation structure 102 (the divot regions 128) or the overlap region of the floating gate 114 and the gate dielectric layer 112. As such, the data retention of the memory device is rather unlikely to be affected by the quality of the gate dielectric layer 112, and the reliability of the memory device is improved.

A fabricating method of the non-volatile memory regarding the doping manners of the present invention is then described hereinafter.

Figure 4A:
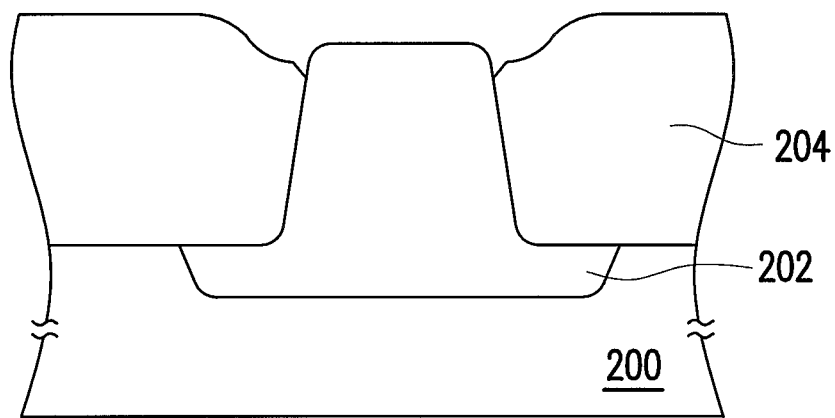
FIGS. 4A through 4E are cross-sectional flowcharts of a fabricating process of a non-volatile memory according to an embodiment of the present invention.
Figure 4B:
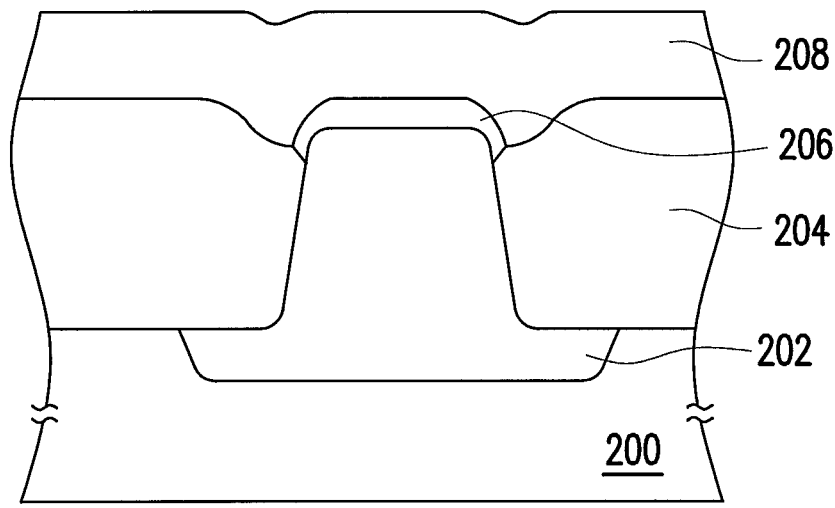
Figure 4C:
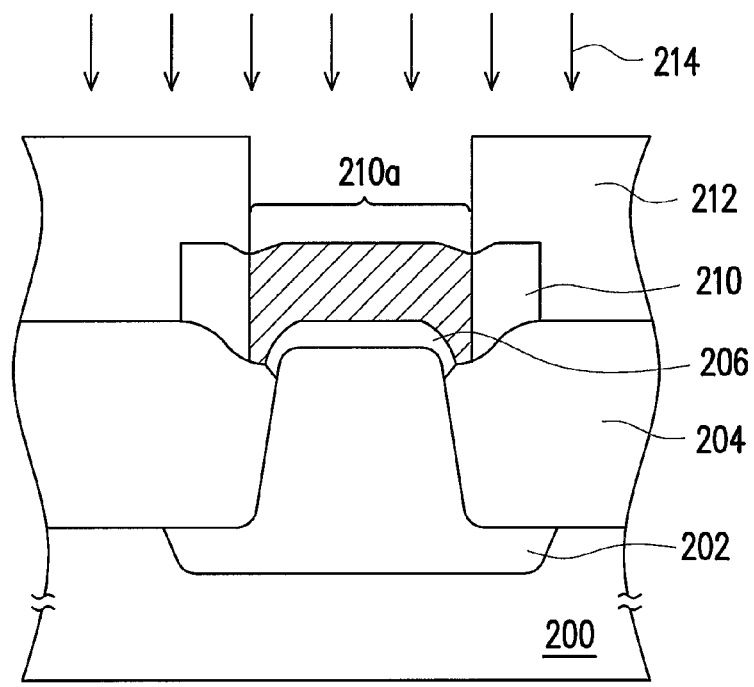
Figure 4D:
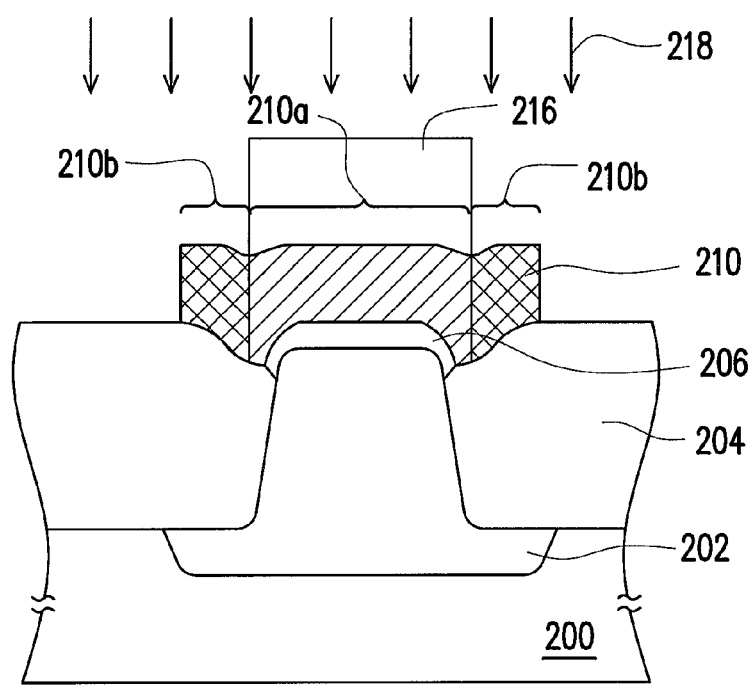
Figure 4E:
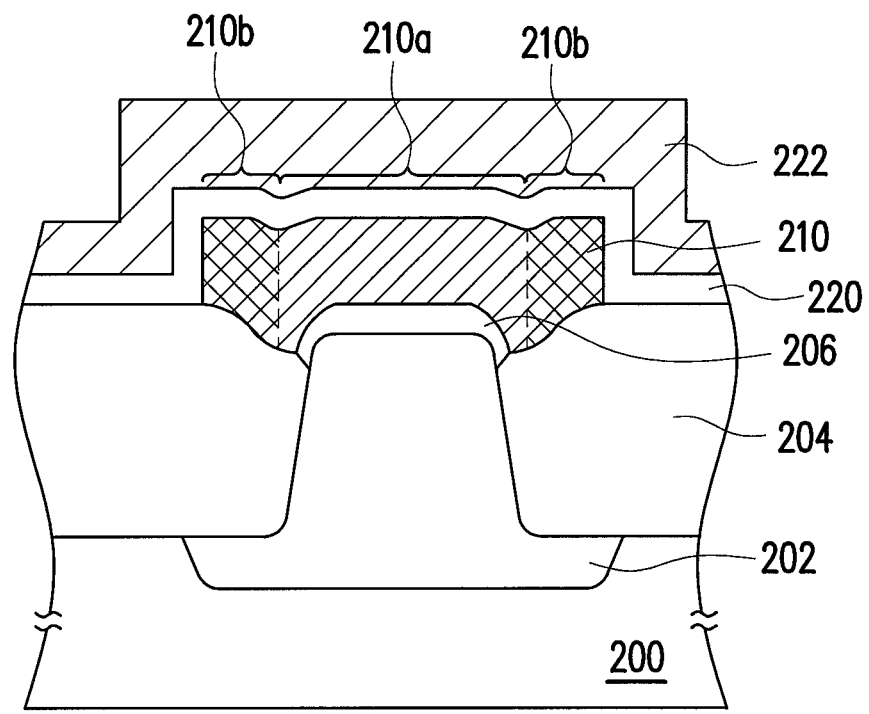

FIGS. 4A through 4E are cross-sectional flowcharts of a fabricating process of a non-volatile memory according to the present invention. FIGS. 4A and 4E are corresponding to the cross-section taken along the line B-B' depicted in FIG. 1A.

First, as shown in FIG. 4A, a substrate 200 is provided. The substrate 200 is, for example, a silicon substrate. A well 202 is formed in the substrate 200. For example, the well 202 is formed by performing an ion implantation process. An isolation structure 204 is then formed in the substrate 200, so as to define an active area. The isolation structure 204 is an STI structure, for example.

Referring to FIG. 4B, a gate dielectric layer 206 and a conductive material layer 208 are formed on the substrate 200. The gate dielectric layer 206 is made of silicon oxide, for example, and a method of forming the gate dielectric layer 206 includes, for example, performing a thermal oxidation process. The conductive material layer 208 is made of, for example, undoped polysilicon or doped polysilicon and is formed by performing a chemical vapor deposition (CVD) process, for example.

As shown in FIG. 4C, the conductive material layer 208 is patterned to form a floating gate 210. The floating gate 210 crosses over the active area, and a portion of the floating gate 210 is located above the isolation structure 204. A mask layer 212 is then formed on the substrate 200. The mask layer 212 at least exposes an overlap region of the floating gate 210 and the gate dielectric layer 206 (a divot region at a junction of the active area and the isolation structure 204). The mask layer 212 is, for example, made of a photoresist material. Besides, the mask layer 212 could be formed by first spin-coating a photoresist material on the substrate 200 and then performing a photolithography process, for example. Certainly, the mask layer 212 can also be fabricated by other materials. In the step of patterning the conductive material layer 208 for forming the floating gate 210, the select gate depicted in FIG. 1A can also be formed simultaneously.

After that, a dopant implantation process 214 is performed to form a first region 210a in one portion of the floating gate 210. In the dopant implantation process 214, the dopant implanted into the floating gate 210 is the n-type dopant or the p-type dopant. The n-type dopant is, for example, $P^+$, $As^+$, $Sb^+$, and so on. By contrast, the p-type dopant is, for example, $B^+$, $BF_2^+$, $In^+$, and so on.

Next, referring to FIG. 4D, the mask layer 212 is removed. A method of removing the mask layer 212 includes, for example, performing a wet photoresist stripping process or a dry photoresist stripping process. After the removal of the mask layer 212, another mask layer 216 is formed on the substrate 200. The mask layer 216 at least exposes the overlap region of the floating gate 210 and the gate dielectric layer 206 (the divot region at the junction of the active area and the isolation structure 204). The mask layer 216 is, for example, made of a photoresist material. Besides, the mask layer 216 is formed by first spin-coating a photoresist material on the substrate 200 and then performing a photolithography process, for example. Certainly, the mask layer 216 can also be fabricated by other materials.

Thereafter, a dopant implantation process 218 is performed to form a second region 210b in the other portion of the floating gate 210. In the dopant implantation process 218, the dopant implanted into the floating gate 210 is the n-type dopant or the p-type dopant. The n-type dopant is, for example, $P^+$, $As^+$, $Sb^+$, and so on. By contrast, the p-type dopant is, for example, $B^+$, $BF_2^+$, $In^+$, and so on. An energy band level of the second region 210b is lower than that of the first region 210a, such that charges stored in the floating gate 210 are away from the overlap region of the floating gate 210 and the gate dielectric layer 206.

In an embodiment, the conductive type of the dopant implanted into the second region 210b in the dopant implantation process 218 is opposite to the conductive type of the dopant implanted into the first region 210a in the dopant implantation process 214. For instance, the p-type dopant is implanted into the first region 210a in the dopant implantation process 214, and the n-type dopant is implanted into the second region 210b in the dopant implantation process 218. Alternatively, the n-type dopant is implanted into the first region 210a in the dopant implantation process 214, and the p-type dopant is implanted into the second region 210b in the dopant implantation process 218.

In another embodiment, the conductive type of the dopant implanted into the second region 210b in the dopant implantation process 218 is the same as the conductive type of the dopant implanted into the first region 210a in the dopant implantation process 214, while the dopant concentration of the second region 210b is less than the dopant concentration of the first region 210a. Here, the p-type dopant is implanted into the first region 210a and the second region 210b in the dopant implantation process 214 and the dopant implantation process 218, respectively; but the difference in doping concentration still leads to the energy band engineering. In an alternative, the n-type dopant is implanted into the first region 210a and the second region 210b in the dopant implantation process 214 and the dopant implantation process 218, respectively. During the implementation of the doping processes 214 and 218 for forming the first region 210a and the second region 210b, the n-type dopant or the p-type dopant can also be implanted into the select gate and the controlling node of the floating gate.

Next, referring to FIG. 4E, the mask layer 216 is removed. A method of removing the mask layer 216 includes, for example, performing the wet photoresist stripping process or the dry photoresist stripping process. In another embodiment of present invention, in order to manufacture the non-volatile memory as shown in FIGS. 2A-2D, an dielectric layer 220 is formed on the substrate 200 after the removal of the mask layer 216,. A material of the dielectric layer 220 is, for example, oxide or nitride. The dielectric layer 220 can be a composite layer such as an oxide/nitride/oxide (ONO) layer. In addition, the dielectric layer 220 is, for example, formed by performing the CVD process. A conductive layer 222 is formed on the dielectric layer 220. A material of the conductive layer 222 is, for example, doped polysilicon or metal. In addition, the conductive layer 222 is, for example, formed by performing the CVD process.

In another embodiment of present invention, in order to manufacture the non-volatile memory as shown in FIGS. 3A-3D, a controlling node of the floating gate is formed in the substrate 100 during the doping processes 214 and 218 for forming the first region 210a and the second region 210b. The n-type dopant or the p-type dopant can also be implanted into the select gate and the controlling node of the floating gate.

In the fabricating method of the non-volatile memory of the present invention, the first region 210a and the second region 210b with different energy band levels are formed in the floating gate 210. The energy band level of the second region 210b is lower than that of the first region 210a, and the second region 210b is away from the junctions of the gate dielectric layer 206 and the isolation structure 204 (the divot regions). Therefore, the electrons stored in the floating gate 210 are collected in the second region 210b, and are away from the interfaces of the gate dielectric layer 206 and the isolation structure 204 (the divot regions) or the overlap region of the floating gate 210 and the gate dielectric layer 206. As such, the data retention of the memory device is rather unlikely to be affected by the quality of the gate dielectric layer 206, and the reliability of the memory device is improved.

Moreover, according to the fabricating method of the non-volatile memory in the present invention, the energy-band engineering in different regions can be changed merely by performing the ion implantation process to implant different dopants or dopants with different concentrations into the different regions of the floating gate 210. Therefore, the non-volatile memory of the present invention can be manufactured without modifying the normal manufacturing process of the complementary MOS. Namely, the fabricating method of the non-volatile memory in the present invention is relatively simple.

To sum up, in the non-volatile memory and the fabricating method thereof according to the present invention, the first region and the second region with different energy band levels are formed in the floating gate. The energy band level of the second region is lower than that of the first region, and the second region is away from the junction of the gate dielectric layer and the isolation structure (the divot region). Therefore, the charges in the floating gate are collectively stored in the second region and are away from the interfaces of the gate dielectric layer and the isolation structure (the divot regions) or the overlap region of the floating gate and the gate dielectric layer. As such, the data retention of the memory device is rather unlikely to be affected by the quality of the gate dielectric layer, and the reliability of the memory device is improved.

Although the present invention has been disclosed by the above embodiments, they are not intended to limit the present invention. Anybody skilled in the art may make some modifications and alterations without departing from the spirit and scope of the present invention. Therefore, the protection range of the present invention falls in the appended claims.

What is claimed is:

1. A non-volatile memory, disposed on a substrate, comprising:
    an isolation structure disposed in the substrate to define an active area;
    a gate dielectric layer disposed on the active area over the substrate; and
    a floating gate disposed upon the gate dielectric layer and the isolation structure, and across the active area, wherein the floating gate comprises a first region and a second region, the first region is at least disposed above the interface of the active area and the isolation structure, the second region is disposed away from interface of the active area and the isolation structure, and the energy band levels of the first region and the second region are made different by doping process so as to keep most of charges injected from the active area stored in the second region of the floating gate, wherein a conductive type of the second region is opposite to a conductive type of the first region.

2. The non-volatile memory as claimed in claim 1, wherein the first region is at least overlapped with the gate dielectric layer.

3. The non-volatile memory as claimed in claim 1, wherein the second region is located right above the isolation structure.

4. The non-volatile memory as claimed in claim 1, wherein the second region is formed at least one of end-cap regions of the floating gate, and the end-cap regions are regions of the floating gate that overlap the isolation structure.

5. The non-volatile memory as claimed in claim 1, further comprises two doped regions formed on the active area, at the respective sides of the floating gate.

6. The non-volatile memory as claimed in claim 1, further comprising a select transistor disposed on the substrate, and electrically connected to the floating gate through one of the two doped regions.

7. The non-volatile memory as claimed in claim 1, wherein the first region is disposed across the active area.

8. The non-volatile memory as claimed in claim 1, wherein the floating gate further comprises a third region, the third region is disposed on the active area, the second region is disposed on the isolation structure, and the first region is disposed between the third and the second regions, wherein a gradient profile of energy band diagram of the first region is formed so as to keep most of charges injected from the active area stored in the second region of the floating gate.

9. The non-volatile memory as claimed in claim 1 further comprises:
    a conductive layer formed on the floating gate; and
    a dielectric layer formed between the conductive layer and the floating gate.

10. The non-volatile memory as claimed in claim 1, further comprises:
    a doped region formed in the substrate; and
    a dielectric layer formed between the doped region and the floating gate.

11. The non-volatile memory as claimed in claim 10, wherein the doped region is formed in a well in the substrate.

12. A non-volatile memory, disposed on a substrate, comprising:
    an isolation structure disposed in the substrate to define an active area;
    a gate dielectric layer disposed on the active area over the substrate; and
    a floating gate disposed upon the gate dielectric layer and the isolation structure, and across the active area, wherein the floating gate comprises a first region and a second region, the first region is disposed adjacent to gate dielectric layer, the second region is disposed apart from the gate dielectric layer, and the energy band levels of the first region and the second region are made different by doping process so as to keep most of charges injected from the active area stored in the second region of the floating gate, wherein the first region is disposed on the active area, as well as the interface of the isolation structure and the active area, and the second region is located right above the isolation structure.

13. The non-volatile memory as claimed in claim 12, wherein the second region is disposed on the first region.

14. The non-volatile memory as claimed in claim 12 further comprises:
    a conductive layer formed on the floating gate; and
    a dielectric layer formed between the conductive layer and the floating gate.

15. The non-volatile memory as claimed in claim 12, further comprises:
    a doped region formed in the substrate; and
    a dielectric layer formed between the doped region and the floating gate.

16. The non-volatile memory as claimed in claim 15, wherein the doped region is formed in a well in the substrate.

17. A fabricating method of a non-volatile memory, comprising:
    providing a substrate, an isolation structure being formed in the substrate to define an active area;
    forming a gate dielectric layer on the active area over the substrate;
    forming a floating gate on the gate dielectric layer, and across the active area;
    performing a first doping process to form a first doping region in a portion of the floating gate; and
    performing a second doping process to form a second doping region in the other portion of the floating gate, wherein an energy band level of the second region is different from an energy band level of the first region, so as to keep most of charges injected from the active area stored in the second region of the floating gate, away from the interface of the floating gate and the gate dielectric layer, wherein a conductive type of the second region is opposite to a conductive type of the first region.

18. The fabricating method of the non-volatile memory as claimed in claim 17, wherein an p-type dopant is implanted into the first region in the first dopant process, and a n-type dopant is implanted into the second region in the second dopant process.

19. The fabricating method of the non-volatile memory as claimed in claim 17, wherein the first region is at least overlapped with the gate dielectric layer.

20. The fabricating method of the non-volatile memory as claimed in claim 17, wherein the second region is formed right above the isolation structure.

21. The fabricating method of the non-volatile memory as claimed in claim 17, further comprising:

forming a select gate on the substrate, wherein the select gate is electrically connected to the floating gate.

22. The fabricating method of the non-volatile memory as claimed in claim 17, further comprising:
   forming a dielectric layer on the floating gate; and
   forming a conductive layer on the dielectric layer.

23. The fabricating method of the non-volatile memory as claimed in claim 17, further comprising:
   forming a doped region in the substrate; and
   forming a dielectric layer between the floating gate and the doped region.

24. A fabricating method of a non-volatile memory, comprising:
   providing a substrate, an isolation structure being formed in the substrate to define an active area;
   forming a gate dielectric layer on the active area over the substrate;
   forming a floating gate consisting of conductive materials on the gate dielectric layer, and across the active area; and
   performing a first doping process to form a first region in a portion of the floating gate, therefore energy band levels of a second region of the floating gate are different from energy band levels of the first region, so as to keep most charges injected from the active area stored in the second region of the floating gate, away from the interface of the floating gate and the gate dielectric layer, wherein the first region is disposed on the active area, as well as the interface of the isolation structure and the active area, and the second region is located right above the isolation structure.

25. The fabricating method of the non-volatile memory as claimed in claim 24, wherein the first region is at least overlapped with the gate dielectric layer.

26. The fabricating method of the non-volatile memory as claimed in claim 24, wherein the second region is formed right above the isolation structure.

27. The fabricating method of the non-volatile memory as claimed in claim 24, further comprising:
   forming a select gate on the substrate, wherein the select gate is electrically connected to the floating gate.

28. The fabricating method of the non-volatile memory as claimed in claim 24, further comprising:
   forming a doped region in the substrate; and
   forming a dielectric layer between the floating gate and the doped region.

29. The fabricating method of the non-volatile memory as claimed in claim 17, wherein an n-type dopant is implanted into the first region in the first doping process, and an p-type dopant is implanted into the second region in the second doping process.

30. The fabricating method of the non-volatile memory as claimed in claim 24, further comprising:
   forming a dielectric layer on the floating gate; and
   forming a conductive layer on the dielectric layer.

* * * * *